United States Patent [19]
Hansen et al.

[11] 3,958,181
[45] May 18, 1976

[54] DISTURBANCE SIGNAL DETECTOR FOR BLANKING CIRCUIT CONTROL

[75] Inventors: Jens Hansen, Hildesheim; Willy Minner, Schwaigern, both of Germany

[73] Assignee: Blaupunkt-Werke GmbH, Hildesheim, Germany

[22] Filed: May 6, 1975

[21] Appl. No.: 575,080

[30] Foreign Application Priority Data
May 20, 1974 Germany............................ 2424450

[52] U.S. Cl................................. 325/480; 325/349; 325/377; 325/475
[51] Int. Cl.² ............................................ H04B 1/12
[58] Field of Search ........... 325/348, 349, 377, 383, 325/480, 473, 478, 475, 476; 179/1 P; 178/DIG. 12; 330/16, 17, 31, 152, 154

[56] References Cited
UNITED STATES PATENTS

| | | | |
|---|---|---|---|
| 3,413,492 | 11/1968 | Schneider | 330/17 |
| 3,509,468 | 4/1970 | Overlie | 325/480 |
| 3,538,253 | 11/1970 | Braun | 325/473 |

*Primary Examiner*—Robert L. Griffin
*Assistant Examiner*—Jin F. Ng
*Attorney, Agent, or Firm*—William R. Woodward

[57] ABSTRACT

A frequency sensitive network responsive to frequencies somewhat above the useful signal band of a demodulated radio signal is interconnected with the inputs of a differential amplifier, so that the desired signal and the portions of the interference signals unaffected by the frequency sensitive circuit cancel out and a "stripped" interference signal is obtained which is fed to a transistor circuit that produces trigger pulses for a multivibrator, regardless of which side of the differential amplifier first produces a pulse. The multivibrator provides pulses to a blanking switch and also charges a capacitor in a RC network, in which charge accumulates when the control pulses are bunched closely in time and this effect is used to produce a bias for disabling the provision of trigger pulses to the multivibrator until the capacitor charge leaks off.

7 Claims, 8 Drawing Figures

DISTURBANCE SIGNAL DETECTOR FOR BLANKING CIRCUIT CONTROL

This invention relates to a circuit for detecting disturbance signals lying beyond a limit frequency of the usable channel of a signal being received, for blanking control of a receiver responsive to signals in the usable channel. The detection circuit and the blanking control form what is known in the art as a noise blanking circuit.

Such circuits are used to trigger a switching operation in radio receivers that momentarily interrupt the signal path when a disturbance occurs in such a way that the disturbance makes no audible effects in the received radio signal. They are particularly effective for eliminating noise from gasoline engine ignition, electric motor hash and the like.

In the known arrangement, the blanking circuits are disposed directly behind the demodulator of the radio receiver. When a disturbance occurs, the signal path is interrupted and, in general, the signal value existing before the disturbance and stored during the disturbance interval is then supplied to the following low-frequency stage of the receiver.

One known circuit comprises a rejection filter in order to prevent the carrier oscillations present in stereo or commercial radio emissions from operating in the same way as disturbances and a resonant circuit (about 300 kHz) that is excited by high-frequency components of a disturbance to produce a damped oscillation. This oscillation is amplified and rectified with a diode bridge. The rectified oscillation switches on an otherwise non-conducting transistor which produces a trigger pulse at its output. The rectification of the oscillation with the diode bridge is necessary, since the oscillation can begin either with a positive or a negative halfwave, according to whether the disturbance pulse begins with a positive or a negative front edge, for the transistor must be made conducting in both cases at the beginning of the disturbance.

The diode bridge must have d.c. isolation from the current supply. For this reason, the oscillation excited in the resonant circuit is coupled to the diode bridge through capacitors.

There are disadvantages to this known circuit because for suppression of the carrier waves of the useful signal, a rejection circuit is necessary and, as already mentioned, the coupling capacitors are also necessary. These circuit components make it difficult to produce this known circuit in the form of a monolithic integrated circuit, because these components do not lend themselves to incorporation in an integrated circuit because of the required electrical magnitudes.

It is an object of the invention to find a new circuit principle for noise blanking that does not have the above-mentioned disadvantages.

SUBJECT MATTER OF THE PRESENT INVENTION

Briefly, a frequency sensitive network is provided that is capable of modifying the amplitudes of signal components beyond a limiting frequency of the useful signal channel and its input terminal is directly connected to a first control input and its output connection to a second control input of a symmetrical semiconductor differential amplifier, the differential outputs of which are connected to the control inputs of what may be referred to as a "push-push" transistor circuit provided with a bias tending to turn it off and having the output electrodes connected together and furnishing an output providing control pulses to a blanking circuit for the receiver. In the preferred form of the invention, these control pulses are first fed to a multivibrator which provides the blanking pulses. The "push-push" circuit responds, no matter which side of the differential amplifier produces an output pulse. The circuit is fully capable of production as an integrated circuit, except for the resonant circuit or the like at its input.

There are further advantages, because the operation of the circuit of the invention can be improved by providing further circuit means that will prevent the generation of blanking pulses when disturbing pulses follow very close together in time. Thus, in the case of a close succession of disturbance pulses, the blanking pulses are prevented from continuously switching out the reception of the desired signal or even from producing substantial distortion of the desired signal when it is no longer possible to get a sufficient sampling and storage of the desired signal in between the blanked disturbance intervals. This operation is preferably carried out by charging a capacitor in a resistancecapacitance circuit so connected that the increasing charge of the capacitor causes an emitter follower to increase the bias of the push-push circuit towards a value at which no more control pulses can be provided to the blanking circuit.

The invention is further described by way of example with reference to the accompanying drawings, in which:

FIG. 1 is a circuit diagram of a stereo radio receiver provided with a noise blanking circuit.

Figure 1:
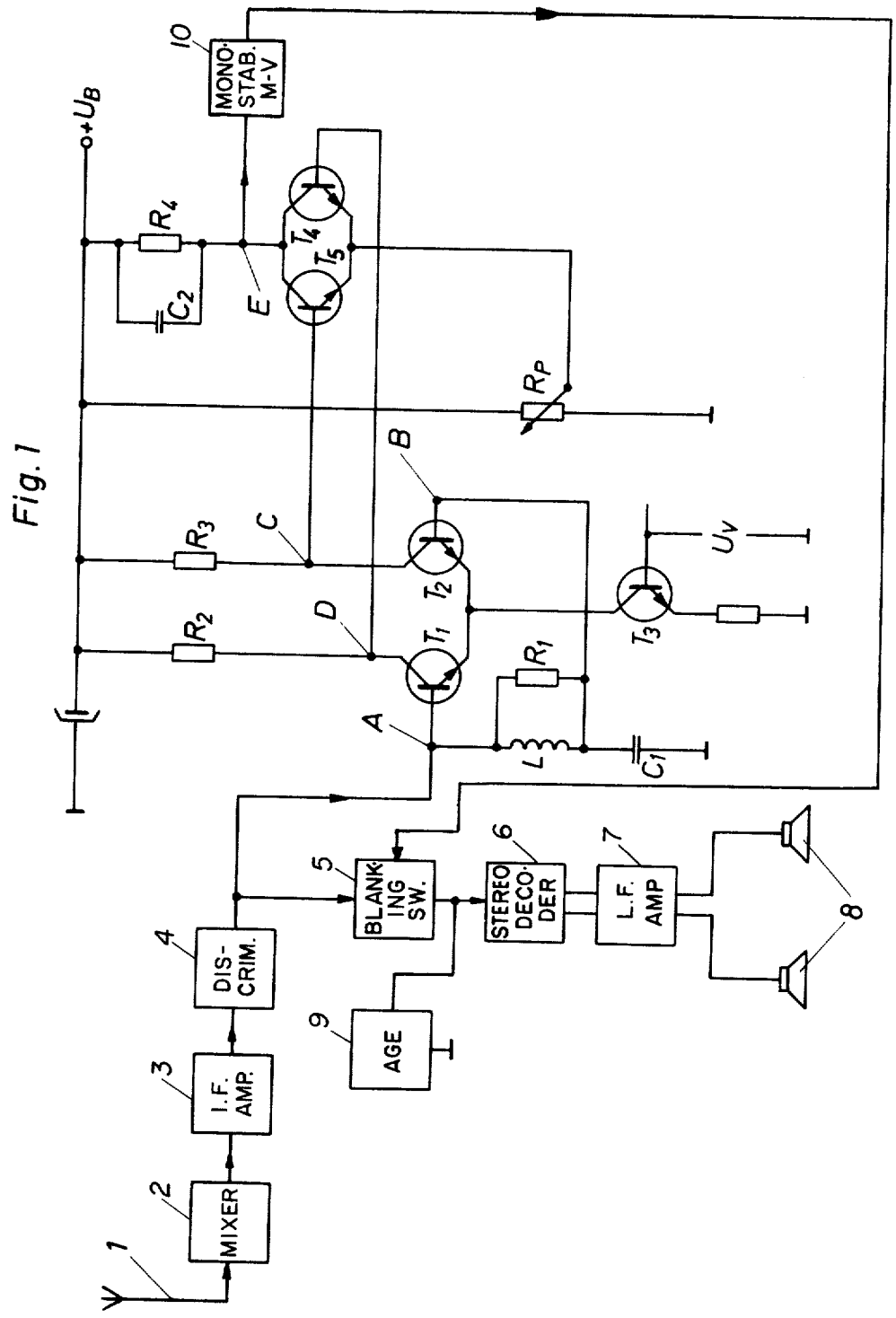
FIG. 1 is a circuit diagram, partly in block form, of a disturbance signal detection circuit according to the invention as provided in an FM radio receiver.

The high-frequency signal picked up by the antenna is converted in frequency by the usual mixer stage 2, amplified in the IF stage 3 and furnished to a discriminator 4, the output of which is a low-frequency signal that in the case of stereo transmissions is a multiplex signal. This signal is furnished, on the one hand, through a blanking switch circuit 5 to the low-frequency stages of the receiver and, on the other hand, as the input signal to the circuit provided according to the invention.

If there are no disturbances superimposed on the signal, the switch 5 is closed and the signal is provided to a low-frequency amplifier 7 and loudspeakers 8, usually after separation into stereo channels in a stereo decoder 6 provided ahead of the low-frequency amplifier 7.

When a transient disturbance occurs, such as is produced by automobile ignition sparks or by nearby operation of certain types of electric machinery, the detector circuit, operating over a multivibrator 10, provides a pulse to the switch 5 causing the latter to open and to interrupt the signal path. The disturbed signal does not reach the loudspeaker 8 and is, therefore, not audible.

In general, a storage circuit 9 is provided to make sure that during a disturbance the undisturbed signal existing before the beginning of the disturbance reaches the loudspeaker 8.

Within the circuit of the present invention, the input signal goes on the one hand directly to the base of a first transistor $T_1$ (circuit point A) and, on the other hand, to a series circuit formed by a coil L and a capacitor $C_1$, the terminal of the capacitor that is not connected to the coil being grounded. A resistor $R_1$ is connected in parallel to the coil L. The coil L, capacitor $C_1$ and resistor $R_1$ form a damped series resonant circuit $L,C_1,R_1$ that is tuned to about 300 kHz. The common connection coil L and capacitor $C_1$ is connected to the base of a second transistor $T_2$ (circuit point B), which forms a differential amplifier $T_1,T_2$ with the first-mentioned transistor $T_1$. The emitters of these two transistors are connected together and their common connection is connected through a current source $T_3$ to ground. The collector of the first transistor $T_1$ (circuit point D) is connected to the positive voltage supply bus $+U_B$ through a collector resistor $R_2$, while the collector of the second transistor $T_2$ (circuit point C) is likewise connected through a collector resistor $R_3$ with the positive voltage bus $+U_B$. An operating voltage source has its positive terminal connected to the positive voltage bus $+U_B$ and its negative terminal grounded. The two collector resistors $R_2$ and $R_3$ have the same value of resistance.

The collector of the first transistor $T_1$ is directly connected to the base of a fourth transistor $T_4$ and the collector of the second transistor $T_2$ is, likewise, directly connected to the base of a fifth transistor $T_5$. The fourth and fifth transistors form a transistor circuit $T_4,T_5$ that may be described as a "push-push" circuit, because of its relation to the differential amplifier $T_1,T_2$, the collectors of $T_4$ and $T_5$ being connected together (circuit point E) and being connected over an integration network formed of a resistor $R_4$ and a capacitor $C_2$ parallel to $R_4$, to the positive voltage supply bus $+U_B$. The potential at the common emitter connection of the fourth and fifth transistors $T_4$ and $T_5$ is determined by use of the tap of a potentiometer $R_p$, the fixed terminals of which are connected across the voltage supply. The output signal, that contains trigger pulses for the multivibrator 10 when disturbances appear, is available at the common collector connection of the transistor circuit $T_4,T_5$ and is provided from that point to the multivibrator 10.

Figure 2:
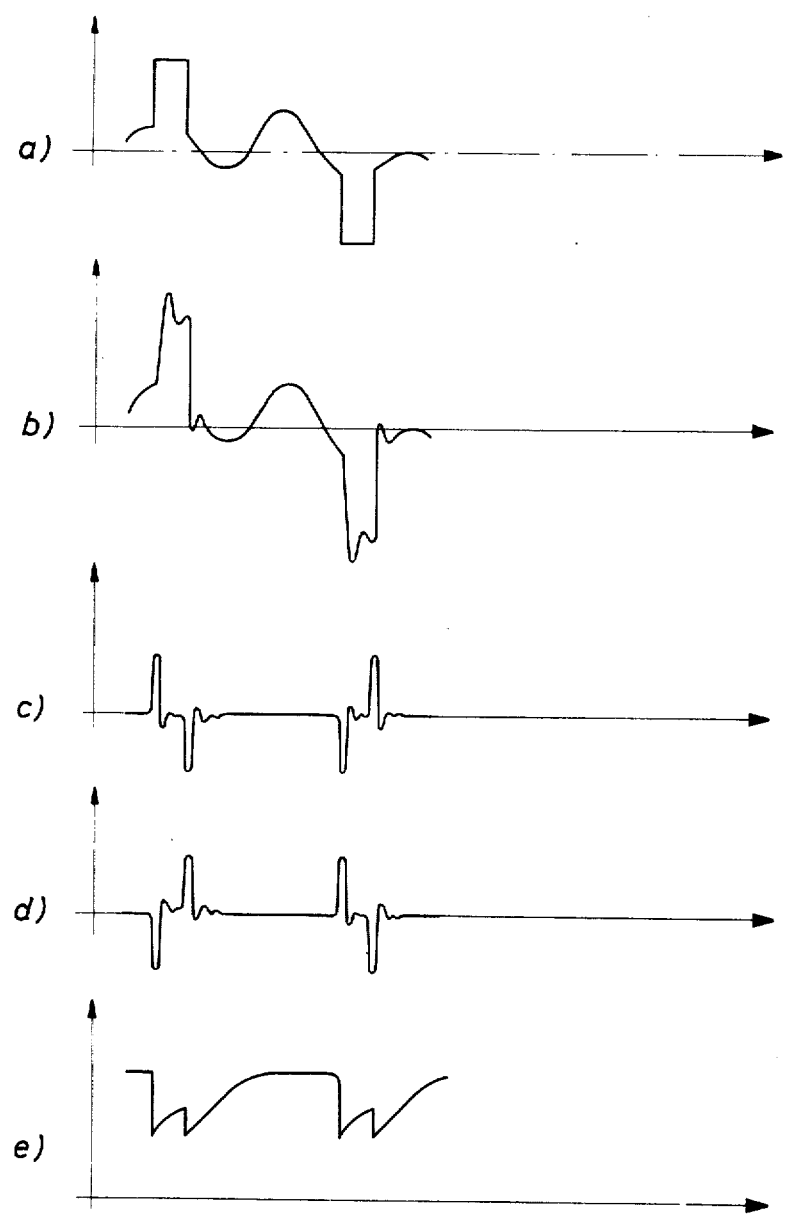
FIG. 2 is a timing diagram showing the time course of signals at points designated A through E in the circuit of FIG. 1.

FIG. 2 shows voltage curves giving the time course of voltage at various points of the circuit for a given disturbance shown in line a) at the top of FIG. 2. It is assumed for purposes of illustration that the disturbance includes a first rectangular pulse disturbance that begins with a positive-rising edge, followed after a small interval by a second rectangular disturbance pulse that starts with a negative-going leading edge. This signal is applied directly to the base of the first transistor $T_1$ (circuit point A). The low-frequency signal components reach the base of the second transistor $T_2$ in unchanged form after passing through the damped series resonant circuit $L,C_1,R_1$. The high-frequency components of the disturbance pulses generate a damped oscillation in the series resonant circuit $L,C_1,R_1$. A damped 300 kHz oscillation is thus superimposed on the disturbed LF signal at the base of the second transistor $T_2$ (circuit point B) at the beginning and at the end of a disturbance pulse according to line a), and the wave shape of this signal is indicated in line b).

The amplified difference of the two signals - i.e. the damped 300 kHz oscillation all by itself - appears both at the collector of the second transistor $T_2$ (circuit point C) and at the collector of the first transistor $T_1$ (circuit point B). The line c) of FIG. 2 shows the signal at point C and the line d) shows the signal at point D. Both these signals are mirror images of each other.

The emitter potential of the transistor circuit $T_4, T_5$ is so adjusted by means of potentiometer $R_p$ that in the absence of disturbances, it is somewhat more positive than the potential at the bases of the transistors, which is to say that the transistor circuit $T_4,T_5$ is blocked. Only when a positive potential of sufficient height is supplied to one of the transistor bases will there be any conduction through the transistor circuit $T_4,T_5$. Hence, only positive portions of the signals at the points C and D have any effect to switch the transistor circuit. Negative signal portions merely maintain the blocked condition of the circuit.

Corresponding to the signal curves shown in lines c) and d), there is produced at the collector terminal of the transistor circuit $T_4,T_5$ (circuit point E) a signal of the form shown in line e) of FIG. 2. When the transistor circuit $T_4,T_5$ is blocked, the point E is practically at the potential of the positive voltage supply bus $+U_B$. If a positive signal of sufficient height reaches one of the base electrodes, however, the transistor circuit $T_4,T_5$ will conduct and the potential at point E drops. After the first 300 kHz half-wave, the potential of point E climbs back up at a rate determined by the time constant of the integration network $C_2,R_4$.

In the example shown, after a short recovery rise of the potential of point E a positive half-wave produced by the end of the square disturbance pulse reaches the other base electrode of the transistor circuit $T_4,T_5$. In consequence, the potential at poine E is once more pulled down. The signal produced by the second disturbance pulse is produced in a similar way. In line e) of FIG. 2, it can be seen that the same kind of signal is produced at point E independent of the polarity of the disturbance signal. The potential drops trigger the multivibrator 10 which, in this case, is most appropriately a monostable multivibrator. This monostable multivibrator 10 controls the blanking switch 5.

Figure 3:
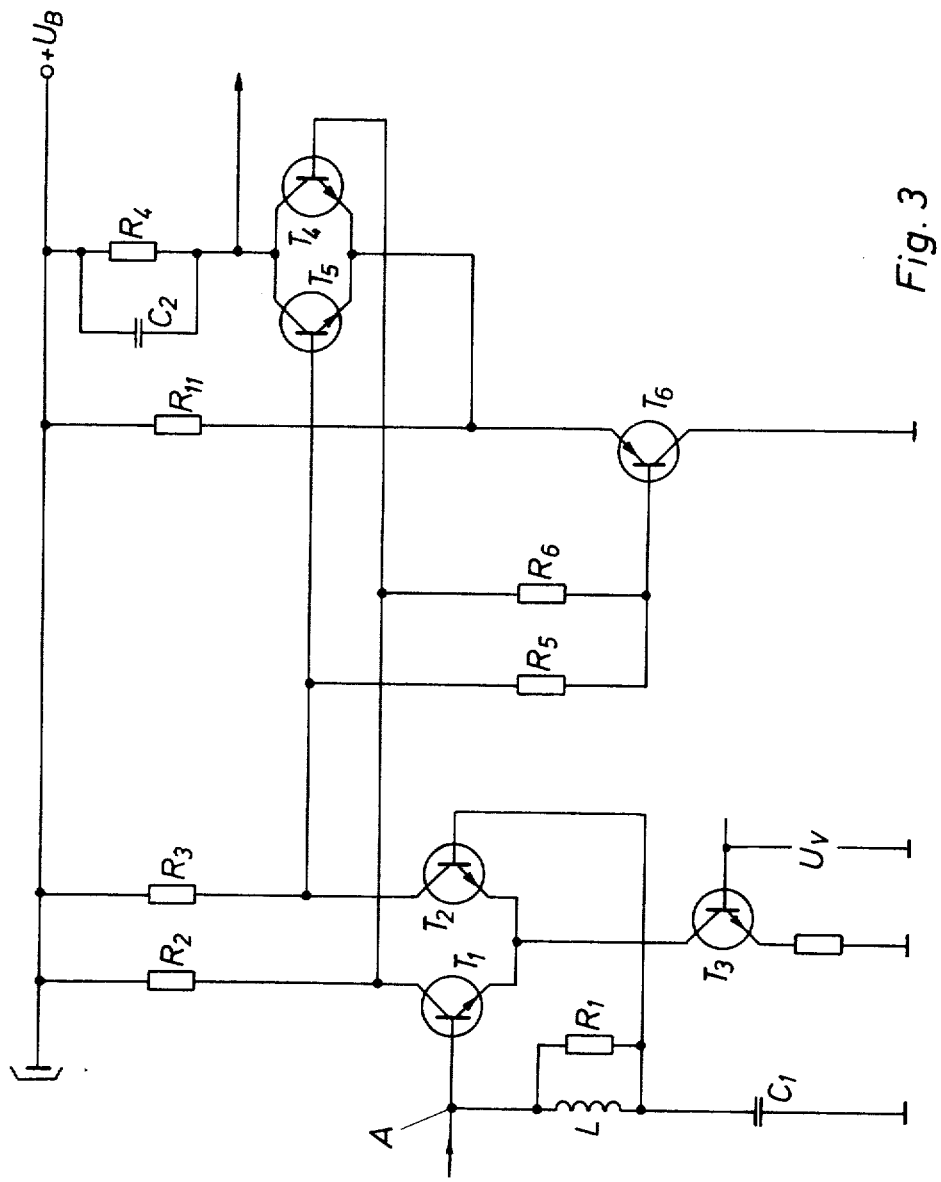
FIG. 3 is a diagram of a modification of the circuit of FIG. 1.

FIG. 3 shows a further developed circuit in which a secure blocking of the transistor circuit $T_4,T_5$ is provided that is, to a great extent, independent of the manufacturing tolerances of the electrical components. In this case, the potentiometer $R_p$ of FIG. 1 is replaced by a transistor $T_6$ arranged in an emitter follower circuit.

The collector of the transistor $T_6$ is directly connected to ground and the corresponding emitter is connected over a resistor $R_{11}$ to the positive voltage bus $+U_B$. The emitter of transistor $T_6$ is also directly connected to the common emitter connection of the transistor circuit $T_4,T_5$. The base of transistor $T_6$ is, on the one hand, connected over a resistor $R_5$ to the base of the fifth transistor $T_5$ and, on the other hand, connected over a resistor $R_6$ to the base of the fourth transistor $T_4$. The resistors $R_5$ and $R_6$ have the same values of resistance, so that the base of the transistor $T_6$ is at the d.c. voltage of the base electrodes of the transistor circuit $T_4,T_5$, since the alternating signals provided to the bases of the transistor circuit $T_4, T_5$ are of opposite phase and, thus, cancel out through addition at the base of the transistor $T_6$.

The potential at the common emitter connection of the transistor circuit $T_4,T_5$ is thus more positive than the quiescent potential at the base electrodes by the forward voltage of the emitter-base junction of the transistor $T_6$ considered as a diode.

Figure 4:
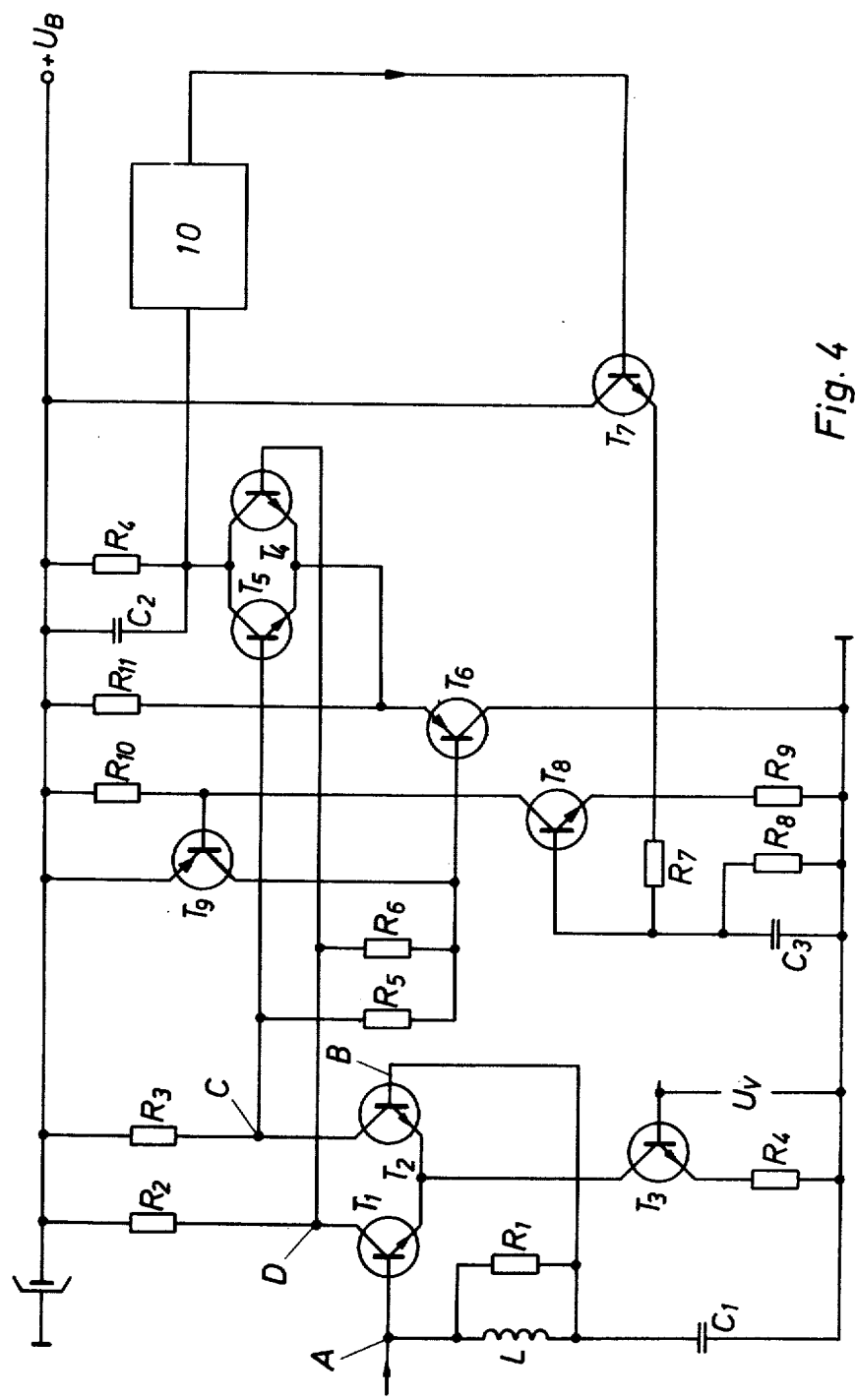
FIG. 4 shows the circuit of FIG. 3 provided with additional means for interrupting the provision of trigger pulses under certain conditions.

FIG. 4 shows a circuit for blocking the operation of the multivibrator 10 in the event disturbances appear bunched together over a considerable period of time. A transistor $T_7$ is turned on by the output pulses of the multivibrator 10. The collector of transistor $T_7$ is connected to the positive voltage bus $+U_B$ at its emitter connected over a series connection of resistors $R_7$ and $R_8$ to ground, there being a capacitor $C_3$ connected in parallel to resistor $R_8$.

If the capacitor $C_3$ is charged sufficiently by a large number of pulses closely bunched in time, the base electrode of a transistor $T_8$ that is connected to the "hot" side of the capacitor $C_3$ becomes biased sufficiently to turn on the transistor $T_8$. The emitter of transistor $T_8$ is connected over an emitter-resistor $R_9$ to ground, while its collector is connected over a collector resistor $R_{10}$ to the positive voltage bus $+U_B$. The collector of transistor $T_8$ is also connected directly to the base of a further transistor $T_9$ which has its emitter directly connected to the positive voltage bus $+U_B$ and its collector directly connected to the base of the emitter follower transistor $T_6$.

If the capacitor $C_3$ is sufficiently charged by a prolonged succession of output pulses of the multivibrator that are closely bunched in time, both transistors $T_8$ and $T_9$ are turned on. In consequence, the base electrode of transistor $T_6$ is put practically at the potential of the positive voltage supply bus $+U_B$. The emitter of transistor $T_6$ follows the potential of the base and blocks the transistor circuit $T_4,T_5$ even in the presence of disturbance pulses. This operation has the effect that no trigger pulses are produced and the multivibrator 10 is prevented from operating. Only when the capacitor $C_3$ thereafter discharges sufficiently over the resistor $R_8$ to allow the transistor $T_8$ to become non-conducting, can trigger pulses again reach the monostable multivibrator 10.

The series resonant circuit $L,C_1,R_1$ can, of course, be replaced by any other type of network that can modify the amplitude of frequencies lying outside the limit frequency of the desired signal, since the signal in question is the signal provided by the discriminator, known as the low-frequency signal or as the base band signal, resulting from demodulation by the discriminator, the function of the series resonant circuit or other similarly operating frequency sensitive network is, accordingly, to modify the amplitudes of the frequency components of interference present with the signal that lie above the upper edge of the channel utilized by the desired signal and, of course, any modification of sufficient magnitude will produce outputs of the differential amplifier, with the unmodified portions of the signal cancelling each other out, whereas at the frequencies at which the network produces modification, the provision of the unmodified signal to one side of the differential amplifier and of the modified signal at the other side of the differential amplifier will provide an output containing only the frequencies at which the network has produced amplitude modification. It is, of course, desirable that the amplitude modification in one sense or the other should occur without substantial delay, since the control pulse to the blanking switch must be applied before the disturbance can produce an audible effect on the output of the receiver. For this reason, it is more practical to modify the amplitude of signal components beyond the upper frequency limit of the signal channel than to attempt to modify the frequency components below the lower frequency limit of the base band signal when the input signal to the disturbance detection circuit is a base band signal that extends to frequencies down in the audio frequency range.

Although the invention has been described with reference to particular illustrative embodiments, variations are accordingly possible within the inventive concept.

For example, it is also possible to use field effect transistors and to use MOS integrated circuit technology instead of bipolar transistor technology.

The term ground potential is used in its ordinary general sense in the electrical art and may mean chassis potential, frame potential or any other such substantially constant readily available basic reference potential.

We claim:

1. Disturbance signal detecting circuit for receiver blanking control, comprising:
    a frequency sensitive network responsive to disturbance signals in a frequency region outside a usable signal channel and capable of modifying the amplitude of signal components in said off-channel frequency region;
    a symmetrically constituted differential amplifier $(T_1,T_2)$ having at least one differentially connected pair of semiconductor devices and having first and second differential inputs connected respectively to control electrodes of said semiconductor devices, differential outputs connected to output electrodes of said devices and a common mode electrode connection, said first input being connected to the input signal connection of said network $(L,C_1,R_1)$ and said second input being connected to an output connection of said network;
    a transistor circuit comprising two transistors $(T_4,T_5)$ having common connections at both ends of the switching paths of the transistors and provided with a bias in the blocking direction, said outputs of said differential amplifier being respectively connected to the electrically separate control electrodes of said transistor circuit, and
    means for providing receiver control pulses from one of said common connections of said transistor circuit $(T_4,T_5)$ suitable for control of a blanking switch in a receiver arranged to respond to signals in said usable channel.

2. Circuit as defined in claim 1 in which emitter potential of said transistor circuit $(T_4,T_5)$ is determined by an emitter follower $(T_6)$ having a base electrode provided with bias through the common control electrode bias of said transistor circuit $(T_4,T_5)$.

3. Circuit as defined in claim 1 in which said means for providing receiver control pulses includes a multivibrator (10) responsive to triggering input from said common connection and arranged to supply control pulses to blanking switch means (5) of said receiver.

4. Circuit as defined in claim 3 in which a capacitor $(C_3)$ is provided which is arranged to be charged by output pulses of said multivibrator (10) and to cause the triggering of said multivibrator (10) to be interrupted when a predetermined value of the number of said output pulses per unit of time is exceeded.

5. Circuit as defined in claim 4 in which means are provided for raising the potential at the base of said emitter follower ($T_6$) in response to charging of said capacitor, whereby the triggering of said multivibrator (10) is interrupted when said capacitor is charged to a voltage exceeding a predetermined voltage.

6. Circuit as defined in claim 5 in which said frequency sensitive network is a resonant circuit tuned to a frequency outside a limiting frequency of said usable channel.

7. Circuit as defined in claim 5 in which said frequency sensitive network comprises a capacitor connected between said second input of said differential amplifier and a grounding potential, and in which a resistance is connected between the ungrounded terminal of said capacitor and said first input of said differential amplifier ($T_1, T_2$).

* * * * *